United States Patent
Malinge et al.

(10) Patent No.: US 8,183,639 B2
(45) Date of Patent: May 22, 2012

(54) DUAL PORT STATIC RANDOM ACCESS MEMORY CELL LAYOUT

(75) Inventors: Pierre Malinge, Beacon, NY (US); Jack M. Higman, Austin, TX (US); Sanjay R. Parihar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/899,663

(22) Filed: Oct. 7, 2010

(65) Prior Publication Data

US 2012/0086082 A1 Apr. 12, 2012

(51) Int. Cl.
*H01L 21/70* (2006.01)
(52) U.S. Cl. ........ 257/368; 257/903; 257/393; 257/347; 257/390; 257/369; 257/E21.661; 257/E27.098; 257/E29.309; 257/E27.06
(58) Field of Classification Search ................ 257/368, 257/903, 347, 348, E21.661, E27.098, E29.309, 257/E27.06, E21.645, 390, 369; 438/306
See application file for complete search history.

(56) References Cited

U.S. PATENT DOCUMENTS

2008/0197419 A1 8/2008 Liaw
2010/0301419 A1* 12/2010 Anderson et al. ............. 257/368

* cited by examiner

*Primary Examiner* — Marc Armand
(74) *Attorney, Agent, or Firm* — Daniel D. Hill; James L. Clingan, Jr.

(57) ABSTRACT

A dual port static random access memory cell has pull-down transistors, pull-up transistors, and pass transistors. A first active region has a first pull-down transistor coupled to a true data node, a second pull-down transistor coupled to a complementary data node; a first pass transistor coupled to the true data node, and a second pass transistor coupled to the complementary data node. A second active region has the same size and shape as the first active region and has a third pull-down transistor coupled in parallel to the first-pull down transistor, a fourth pull-down transistor coupled in parallel to the second pull-down transistor; a third pass transistor coupled to the true data node, and a fourth pass transistor coupled to the complementary data node. A first pull-up transistor and a second pull-up transistor are located between the first and second active regions.

19 Claims, 5 Drawing Sheets

DUAL PORT STATIC RANDOM ACCESS MEMORY CELL LAYOUT

BACKGROUND

1. Field

This disclosure relates generally to semiconductor memories, and more specifically, to a layout for a dual port static random access memory (SRAM) cell.

2. Related Art

Static random access memories are generally used in applications requiring high speed. A dual port SRAM may include more than one word line and/or more than one pairs of bit lines. FIG. 1 illustrates a schematic diagram of a prior art dual port SRAM cell having access transistors, or pass gates PG1-PG4, pull-up transistors PU1 and PU2, and pull-down transistors PD1-PD4. The SRAM cell of FIG. 1 is based on a conventional six transistor single port SRAM cell except that the SRAM cell of FIG. 1 has two parallel-connected pull-down transistors coupled to each storage node N1 and N2 instead of one very wide transistor, and two word lines. The pull-up and pull-down transistors are coupled to form two cross-coupled inverters with the connections of input and output terminals of the inverters forming storage nodes. The storage nodes are coupled to bit line pairs BL1/BLB1 or BL2/BLB2 via one of the word lines WL1 or WL2. A data bit may be stored on storage nodes N1 and N2 as complementary logic states.

FIG. 2 illustrates a prior art layout of a dual port SRAM cell. The dual port SRAM layout of FIG. 2 is generally based on a standard single port six transistor SRAM cell with reference numerals corresponding to elements in FIG. 1. In FIG. 2, active regions formed in a substrate are indicated using cross-hatching and polysilicon features formed above the active regions are indicated using double cross-hatching. Bit lines, word lines, and power supply conductors are formed in a metal layer above the polysilicon features. In the layout of FIG. 2, access transistors PG1 and PG4 are added at each extremity of the layout design of FIG. 2. The two additional access transistors allow two independent word lines WL1 and WL2 to access the memory cell storage nodes N1 and N2. However, simply adding two additional access transistors to create a dual port cell from a single port design may create issues that become more severe with smaller feature sizes and lower power supply voltages. For example, the additional access transistors PG1 and PG4 may have a significant systematic mismatch due to asymmetry with access transistors PG2 and PG3 causing the access transistors PG1 and PG 4 to produce significantly less drain current. Pass gate PG4 has a longer path to storage node N2 than pass gate PG 3. Also, lithography variations cause an effective gate width difference between the pull-down transistors PD1 and PD2 and access transistors PG2 and PG3 to adversely affect read and write margins. In addition, as can be seen in FIG. 2 the layout for the prior art SRAM cell is very wide with respect to its height, causing increased parasitic interconnection capacitance.

Therefore, what is needed is an SRAM cell layout that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 2:
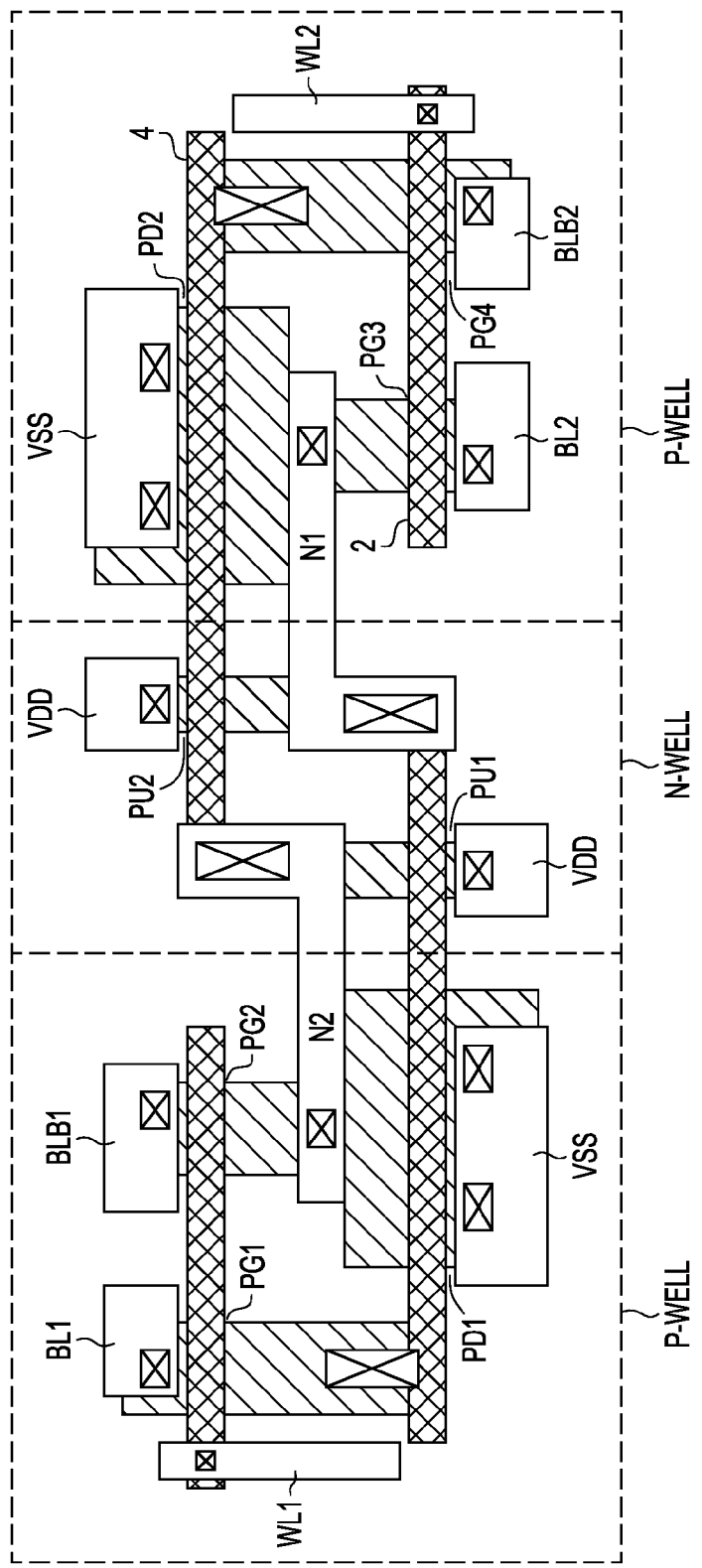
FIG. 2 illustrates a prior art layout of a dual port SRAM cell.

Generally, there is provided, an SRAM cell layout having symmetrical access transistors and multiple parallel-connected pull-down transistors. The symmetrical access transistors provide lower mismatch while the parallel-connected pull-down transistors provide a better width transition than one very wide transistor. Also, all of the access transistors are connected to the internal storage nodes using metal and are fully symmetrical, thus reducing mismatch. The layout also provides a better height to width ratio reducing the word line parasitic capacitance as compared to the prior art layout of FIG. 2.

In one aspect, there is provided dual port static random access memory cell having pull-down transistors, pull-up transistors, and pass transistors, comprising: a first active region having a first pull-down transistor coupled to a first data node, a second pull-down transistor coupled to a complementary data node that is complementary to the first data node; a first pass transistor coupled to the first data node, and a second pass transistor coupled to the complementary data node; a second active region having the same size and shape as the first active region having a third pull-down transistor coupled in parallel to the first-pull down transistor, a fourth pull-down transistor coupled in parallel to the second pull-down transistor; a third pass transistor coupled to the first data node, and a fourth pass transistor coupled to the complementary data node; and a first pull-up transistor and a second pull-up transistor located between the first and second active regions. The first pull-up transistor may be located in a third active region and the second pull-up transistor is located in a fourth active region. The third and fourth active regions may have the same size and shape. The third active region may comprise a first N well. The first active region may comprise a first P well and the second active region comprises a second P well. The first data node may comprise a first metal layer and the second data node may comprise a second metal layer, wherein the first metal layer and the second metal layer have the same size and shape. The first data node may further comprise a first polysilicon layer contacting the first metal layer and the second data node may further comprise a second polysilicon layer contacting the second metal layer, wherein the first polysilicon layer and the second polysilicon layer may have the same size and shape. The first pass transistor may have a gate having a first extension to a first contact for contacting a first word line; the second pass transistor may have a gate having a second extension to a second contact for contacting the first word line; and the first extension and the second extension have the same size and shape. The third pass transistor may have a gate having a third extension to a third contact for contacting a second word line; the fourth pass transistor may have a gate having a fourth extension to a fourth contact for contacting the second word line; and the third extension and the fourth extension may have the same size and shape as the first extension and the second extension. The first pass transistor may have a current electrode coupled to a contact for contacting a first bit line; the second pass transistor may have a current electrode coupled to a contact for contacting a first complementary bit line for carrying data complementary to data carried by the first bit line; the third pass transistor may have a current electrode coupled to a contact for contacting a second bit line; and the fourth transistor may have a current electrode coupled to a contact for contacting a second complementary bit line for carrying data complementary to data carried by the second bit line. The first pull-down transistor and the second pull-down transistor may be located between the first pass transistor and the second pass transistor; and the third pull-down transistor and the fourth pull-down transistor may be located between the third pass transistor and the fourth pass transistor.

In another aspect, there is provided, a method of making a dual port static random access memory cell, comprising: forming a first active region having a first shape and size; forming a second active region having the first shape and size; forming a first pass transistor in the first active region contacting a first bit line contact and a first word line contact; forming a second pass transistor in the first active region contacting a second bit line contact and a second word line contact, wherein: the first word line contact and the second word line contact are for contacting a first word line, the first bit line contact is for contacting a first bit line; and the second bit line contact is for contacting a bit line complementary to the first bit line; forming a first pull-down transistor and a second pull-down transistor in the first active region; forming a third pass transistor in the second active region contacting a third bit line contact and a third word line contact; forming a fourth pass transistor in the second active region contacting a fourth bit line contact and a fourth word line contact, wherein: the third word line contact and the fourth word line contact are for contacting a second word line, the third bit line contact is for contacting a second bit line; and the fourth bit line contact is for contacting a bit line complementary to the second bit line; forming a third pull-down transistor and a fourth pull-down transistor in the second active region; coupling the first pull-down transistor in parallel with the third pull-down transistor; coupling the second pull-down transistor in parallel with the fourth pull-down transistor; and forming a first pull-up transistor and a second pull-up transistor between the first active region and the second active region. The step of forming the first pull-up transistor and the second pull-up transistor may comprise: forming a third active region between the first and second active regions having a second shape and size; forming a fourth active region between the first and second active regions having the second shape and size; forming the first pull-up transistor in the third active region; and forming the second pull-up transistor in the fourth active region. The step of coupling the first pull-down transistor in parallel with the third pull-down transistor may comprise forming a first metal layer having a third size and shape, wherein a first end of the first metal layer electrically contacts a first current electrode of the first pull-down transistor and a second end of the first metal layer electrically contacts a first current electrode of the third pull-down transistor. The step of coupling the second pull-down transistor in parallel with the fourth pull-down transistor may comprise forming a second metal layer having the third size and shape, wherein a first end of the second metal layer may electrically contact a first current electrode of the second pull-down transistor and a second end of the second metal layer may electrically contact a first current electrode of the fourth pull-down transistor. The step of coupling the first pull-down transistor in parallel with the third pull-down transistor may comprise coupling a second current electrode of the first pull-down transistor to ground and coupling a second current electrode of the third pull-down transistor to ground. The step of forming the first active region may comprise forming an isolation region in a semiconductor substrate to define a surrounding boundary of the first active region and doping the substrate within the surrounding boundary to p-type. The steps of forming the first pull-down transistor and second pull-down transistor may be further characterized as forming the first and second pull-down transistors between the first and second pass transistors.

In yet another embodiment, there is provided, a dual port static random access memory cell, comprising: a first active region having a first size and shape; a first pass transistor having a first current electrode and second current electrode in the first active region; a first pull-down transistor having a first current electrode and a second current electrode in the first active region, wherein the first current electrode of the first pull-down transistor is in common with the second current electrode of the first pass transistor; a second pass transistor having a first current electrode and second current electrode in the first active region; a second pull-down transistor having a first current electrode and a second current electrode in the first active region, wherein the first current electrode of the second pull-down transistor is in common with the second current electrode of the second pass transistor and the second current electrode of the second pull-down transistor is in common with the second current electrode of the first pull-down transistor; a second active region having the first size and shape; a third pass transistor having a first current electrode and second current electrode in the second active region; a third pull-down transistor having a first current electrode and a second current electrode in the second active region, wherein the first current electrode of the third pull-down transistor is in common with the second current electrode of the third pass transistor; a fourth pass transistor having a first current electrode and second current electrode in the second active region; a fourth pull-down transistor having a first current electrode and a second current electrode in the second active region, wherein the first current electrode of the fourth pull-down transistor is in common with the second current electrode of the fourth pass transistor and the second current electrode of the fourth pull-down transistor is in common with the second current electrode of the third pull-down transistor; and a first pull-up transistor and a second pull-up transistor located between the first active region and the second active region. The first current electrode of the first pull-down transistor may be coupled to the first current electrode of the third pull-down transistor through a first metal layer having a second shape and size; the first current electrode of the second pull-down transistor may be coupled to the first current electrode of the fourth pull-down transistor through a second metal layer having the second shape and size; the second current electrodes of the first, second, third, and fourth pull-down transistors may be coupled to a ground terminal; a first continuous conductive layer having a third size and shape may be used as a gate for the first pull-down transistor and a gate for the third pull-down transistor; a second continuous conductive layer having the third size and shape may be used as a gate for the second pull-down transistor and a gate for the fourth pull-down transistor; the first current electrode of the first pass transistor may be coupled to a first bit line; the first current electrode of the second pass transistor may be coupled to a bit line complementary to the first bit line; the first current electrode of the third pass transistor may be coupled to a second bit line; and the first current electrode of the fourth pass transistor may be coupled to a bit line complementary to the second bit line.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

Figure 1:
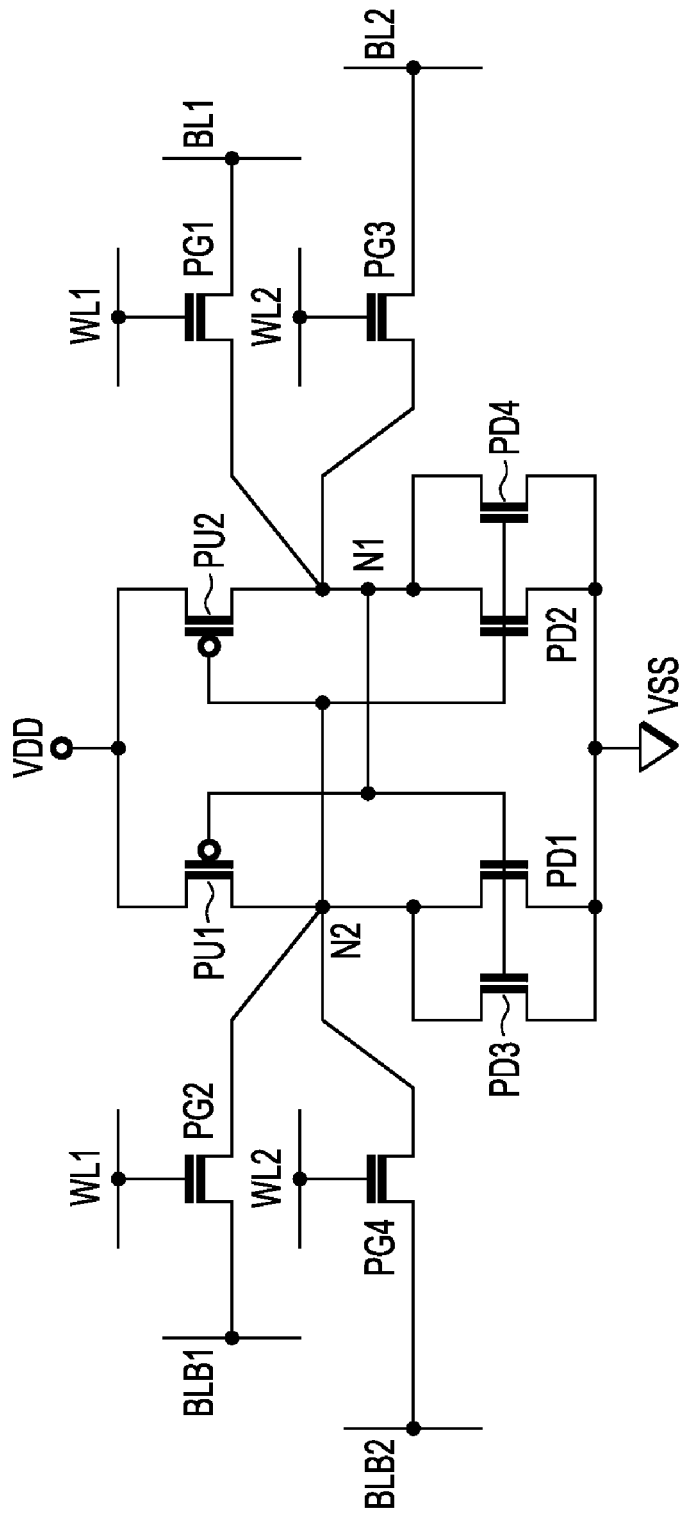
FIG. 1 illustrates a schematic diagram of a prior art dual port SRAM cell.
Figure 3:
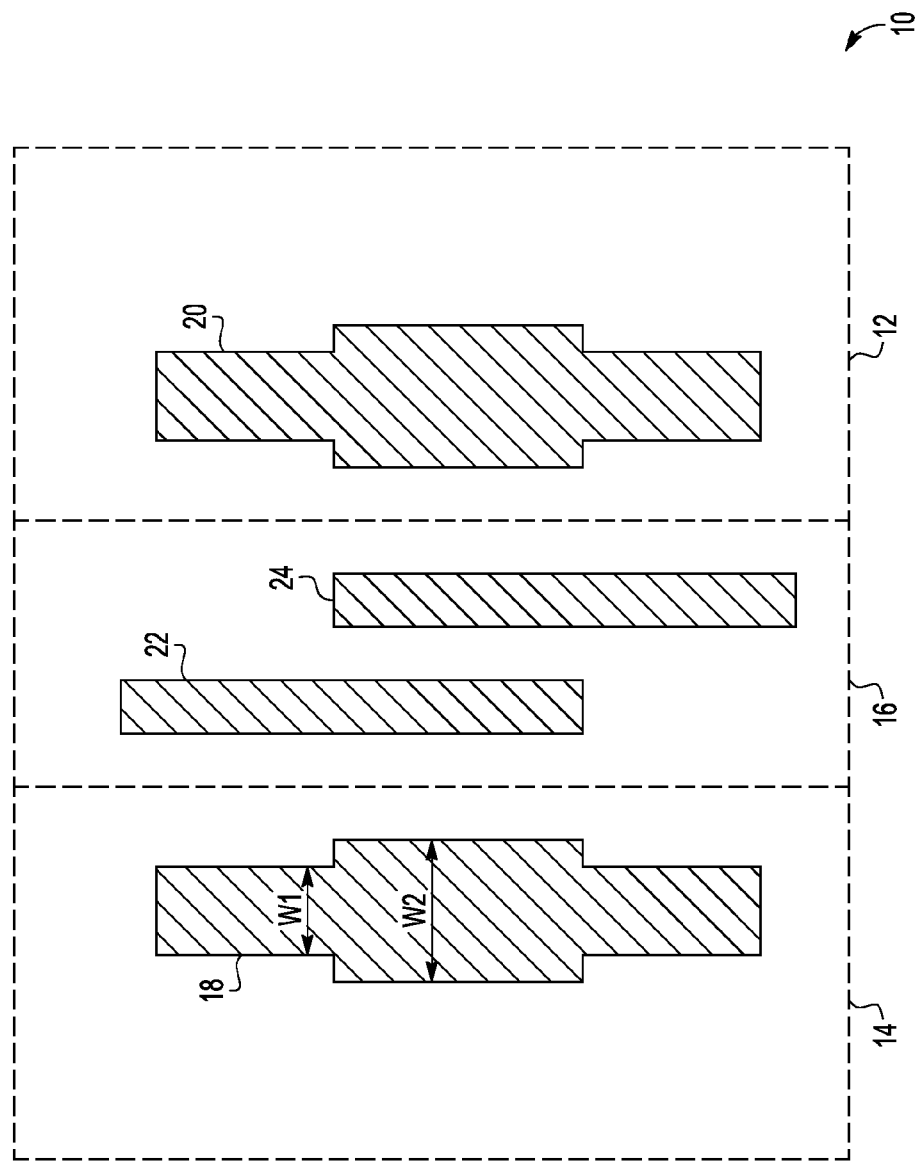
FIG. 3-FIG. 5 illustrate various layers of a layout of a dual port SRAM cell in accordance with an embodiment.
Figure 4:
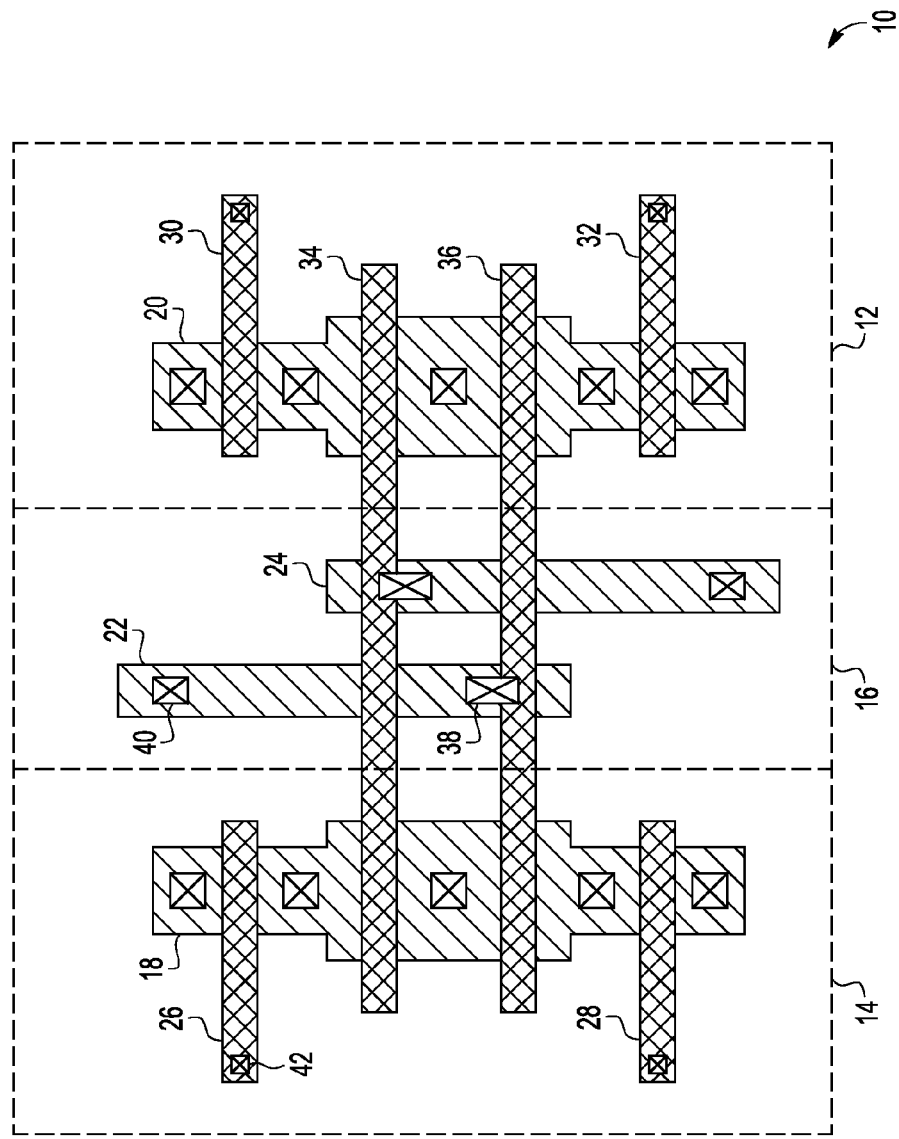
Figure 5:
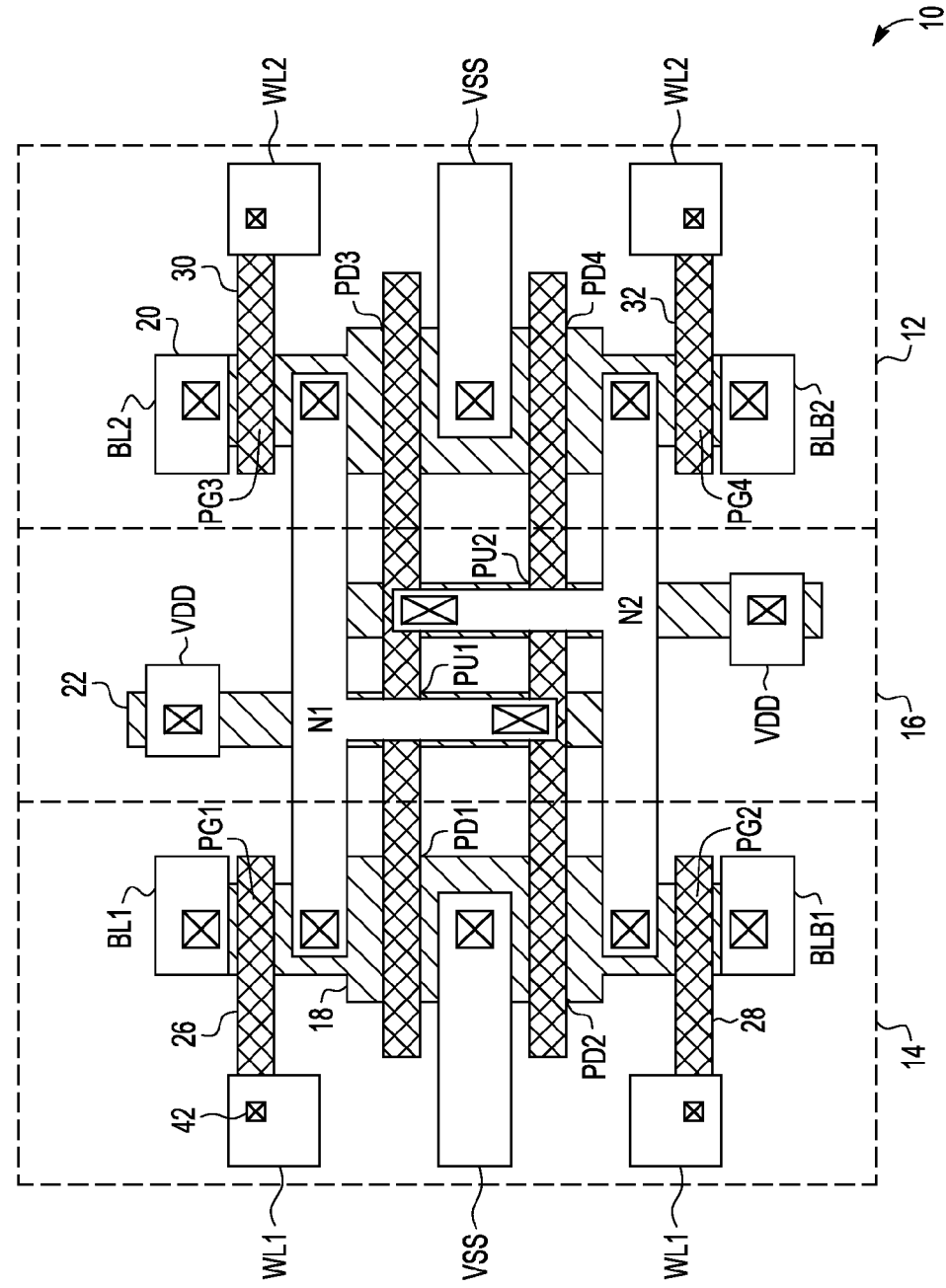

FIG. 3-FIG. 5 illustrate various layers of a layout of dual port SRAM cell 10 in accordance with an embodiment. Dual port SRAM cell layout 10 is a layout of the dual port SRAM cell of FIG. 1. FIG. 3 illustrates a surface of a semiconductor substrate after active regions 18, 20, 22, and 24 are formed. Regions 12, 14, and 16 define well regions, where, in the illustrated embodiment, regions 12 and 14 are characterized as being P-wells, and region 16 is characterized as being an N-well. In a conventional complementary metal oxide semiconductor (CMOS) process, the well regions define the conductivity types of the transistors that are formed therein. For example, P-channel transistors are formed in N-well region 16, and N-channel transistors are formed in P-well regions 12 and 14. Transistor source electrodes, drain electrodes, and channel regions are formed in the active regions. Active regions 18 and 20 each have two widths labeled "W1" and "W2", where W1 is narrower than W2. In another embodiment, widths W1 and W2 may be the same. Widths W1 and W2 define the pass gate transistor width and pull-down transistor width. Active regions 18 and 20 generally have the same size and shape, and active regions 22 and 24 generally have the same size and shape.

FIG. 4 illustrates a surface of a semiconductor substrate after a patterned polysilicon layer is formed over the active regions. The patterned polysilicon layer is double cross-hatched and includes polysilicon features 26, 28, 30, 32, 34, and 36. Contacts are formed on both the polysilicon layer and the active regions, such as for example, contacts 38, 40 and 42. The contacts are used to selectively connect the active regions, polysilicon features, and metal conductors together. In one embodiment, the contacts are formed using Tungsten. Polysilicon features 26, 28, 30, 32, 34, and 36 form the transistors of SRAM cell 10 where they cross active regions 18, 20, 22 and 24. Polysilicon features 26, 28, 30, and 32 have the same size and shape, and polysilicon features 34 and 36 have the same size and shape.

FIG. 5 illustrates a surface of a semiconductor substrate after a metal layer is deposited and patterned to form conductors for SRAM cell layer 10. The metal layer is used to supply power supply voltages VDD and VSS, to provide differential bit line pairs BL1/BLB1 and BL2/BLB2, word lines WL1 and WL2, and to provide storage nodes N1 and N2. Bit line BLB1 is a logical complement of bit line BL1 and bit line BLB2 is a logical complement of bit line BL2. Storage nodes N1 and N2 store a logic state as true and complement voltages on the storage nodes. Transistors PG1, PD1, PD2, and PG2 are formed in continuous active region 18. The source and drain regions of transistors PG3, PD3, PD4, and PG4 are formed in continuous active region 20. Some of the source and drain regions may be common between the transistors of an active region. Pull-down transistors PD3 and PD4 are formed between transistors PG3 and PG4. Pull-down transistors PD1 and PD2 are formed between transistors PG1 and PG2. The source and drain regions of pull-up transistor PU1 are formed in active region 22 and the source and drain regions of pull-up transistor PU2 are formed in active region 24.

The pass transistors couple the data storage nodes N1 and N2 to the bit lines. For example, pass transistor PG1 couples data storage node N1 to bit line BL1 in response to a word line voltage on word line WL1. Pass transistor PG2 couples data storage node N2 to bit line BLB 1 in response to a word line voltage on word line WL1. Access transistors PG1 and PG2 are coupled to word line WL1 and are symmetrical with each other. Access transistors PG3 and PG4 are coupled to word line WL2 and are symmetrical with each other so a mismatch between them will be much lower than in the prior art cell of FIG. 1. More specifically, pass transistor PG1 has a gate formed by polysilicon feature 26. Polysilicon feature 26 has a contact 42 for coupling the gate of pass transistor PG1 to metal word line WL1. Likewise, pass transistor PG2 is formed from polysilicon feature 28 and has a contact for coupling the gate of pass transistor PG2 to metal word line WL1. Polysilicon feature 30 forms the gate of pass transistor PG3. Polysilicon feature 30 has a contact for coupling the gate of pass transistor PG3 to metal word line WL2. Pass transistor PG4 is formed from polysilicon feature 32 and has a contact for coupling the gate of pass transistor PG4 to metal word line WL2. Also, as can be seen in FIG. 5, two pull down transistors are coupled in parallel to each storage node N1 and N2, where the parallel-connected pull down transistors are formed in different well regions. For example, pull-down transistors PD1 and PD3 are connected in parallel but are formed in P-well regions 12 and 14, respectively. Coupling the pull-down transistors in this way contributes to the better width-to-height ratio of SRAM cell layout 10 as compared to the prior art SRAM cell layout of FIG. 1. In addition, all of the access transistors PG1-PG4 are connected to the storage nodes N1 and N2 using metal instead of polysilicon as in the prior art SRAM cell layout of FIG. 1. In one embodiment, the metal comprises copper. In another embodiment, a different metal may be used, such as for example, aluminum. Also, in one embodiment, VDD may be coupled to receive a positive power supply voltage and VSS may be coupled to ground. In another embodiment, the power supply voltages may be different.

A memory array design may be formed from a plurality of SRAM cells similar to SRAM cell layout 10. Starting from the layout of FIG. 5, additional cells are added by mirroring SRAM cell 10 on either side and top and bottom. The top and bottom mirror images are formed by flipping layout 10 around the VDD and bit line contacts. The left and right mirror images are formed by flipping layout 10 around the word line contacts of SRAM layout 10. An array with any number of SRAM cells may be formed in this manner.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A dual port static random access memory cell having pull-down transistors, pull-up transistors, and pass transistors, comprising:
   a first active region having a first pull-down transistor coupled to a first data node, a second pull-down transistor coupled to a complementary data node that is complementary to the first data node;
   a first pass transistor coupled to the first data node, the first pass transistor having a current electrode coupled to a contact for contacting a first bit line, and a second pass transistor coupled to the complementary data node, the second pass transistor having a current electrode coupled to a contact for contacting a first complementary bit line for carrying data complementary to data carried by the first bit line;
   a second active region having the same size and shape as the first active region having a third pull-down transistor coupled in parallel to the first-pull down transistor, a fourth pull-down transistor coupled in parallel to the second pull-down transistor; a third pass transistor coupled to the first data node, the third pass transistor having a current electrode coupled to a contact for contacting a second bit line, and a fourth pass transistor coupled to the complementary data node, the fourth transistor having a current electrode coupled to a contact for contacting a second complementary bit line for carrying data complementary to data carried by the second bit line; and
   a first pull-up transistor and a second pull-up transistor located between the first and second active regions.

2. The dual port static random access memory cell of claim 1, wherein:
   the first pull-up transistor is located in a third active region and the second pull-up transistor is located in a fourth active region.

3. The dual port static random access memory cell of claim 1, wherein the first data node comprises a first metal layer and a second data node comprises a second metal layer, wherein the first metal layer and the second metal layer have the same size and shape.

4. The dual port static random access memory cell of claim 1, wherein:
   the first pass transistor has a gate having a first extension to a first contact for contacting a first word line;
   the second pass transistor has a gate having a second extension to a second contact for contacting the first word line; and
   the first extension and the second extension have the same size and shape.

5. The dual port static random access memory cell of claim 1, wherein:
   the third pass transistor has a gate having a third extension to a third contact for contacting a second word line;
   the fourth pass transistor has a gate having a fourth extension to a fourth contact for contacting the second word line; and
   the third extension and the fourth extension have the same size and shape as the first extension and the second extension.

6. The dual port static random access memory cell of claim 1, wherein:
   the first pull-down transistor and the second pull-down transistor are located between the first pass transistor and the second pass transistor; and
   the third pull-down transistor and the fourth pull-down transistor are located between the third pass transistor and the fourth pass transistor.

7. The dual port static random access memory cell of claim 2 wherein the third and fourth active regions have the same size and shape.

8. The dual port static random access memory cell of claim 7, wherein the third active region comprises a first N well.

9. The dual port static random access memory cell of claim 8, wherein the first active region comprises a first P well and the second active region comprises a second P well.

10. The dual port static random access memory cell of claim 3, wherein the first data node further comprises a first polysilicon layer contacting the first metal layer and the second data node further comprises a second polysilicon layer contacting the second metal layer, wherein the first polysilicon layer and the second polysilicon layer have the same size and shape.

11. A method of making a dual port static random access memory cell, comprising:
    forming a first active region having a first shape and size;
    forming a second active region having the first shape and size;
    forming a first pass transistor in the first active region contacting a first bit line contact and a first word line contact;
    forming a second pass transistor in the first active region contacting a second bit line contact and a second word line contact, wherein:
      the first word line contact and the second word line contact are for contacting a first word line,
      the first bit line contact is for contacting a first bit line; and
      the second bit line contact is for contacting a bit line complementary to the first bit line;
    forming a first pull-down transistor and a second pull-down transistor in the first active region;
    forming a third pass transistor in the second active region contacting a third bit line contact and a third word line contact;
    forming a fourth pass transistor in the second active region contacting a fourth bit line contact and a fourth word line contact, wherein:

the third word line contact and the fourth word line contact are for contacting a second word line;
the third bit line contact is for contacting a second bit line; and
the fourth bit line contact is for contacting a bit line complementary to the second bit line;
forming a third pull-down transistor and a fourth pull-down transistor in the second active region;
coupling the first pull-down transistor in parallel with the third pull-down transistor;
coupling the second pull-down transistor in parallel with the fourth pull-down transistor; and
forming a first pull-up transistor and a second pull-up transistor between the first active region and the second active region.

12. The method of claim 11, wherein the step of forming the first pull-up transistor and the second pull-up transistor comprises:
forming a third active region between the first and second active regions having a second shape and size;
forming a fourth active region between the first and second active regions having the second shape and size;
forming the first pull-up transistor in the third active region; and
forming the second pull-up transistor in the fourth active region.

13. The method of claim 11, wherein the step of coupling the first pull-down transistor in parallel with the third pull-down transistor comprises forming a first metal layer having a third size and shape, wherein a first end of the first metal layer electrically contacts a first current electrode of the first pull-down transistor and a second end of the first metal layer electrically contacts a first current electrode of the third pull-down transistor.

14. The method of claim 11, wherein step of coupling the second pull-down transistor in parallel with the fourth pull-down transistor comprises forming a second metal layer having the third size and shape, wherein a first end of the second metal layer electrically contacts a first current electrode of the second pull-down transistor and a second end of the second metal layer electrically contacts a first current electrode of the fourth pull-down transistor.

15. The method of claim 11, wherein the step of forming the first active region comprises forming an isolation region in a semiconductor substrate to define a surrounding boundary of the first active region and doping the substrate within the surrounding boundary to p-type.

16. The method of claim 11, wherein:
the steps of forming the first pull-down transistor and second pull-down transistor are further characterized as forming the first and second pull-down transistors between the first and second pass transistors.

17. The method of claim 13, wherein the step of coupling the first pull-down transistor in parallel with the third pull-down transistor comprises coupling a second current electrode of the first pull-down transistor to ground and coupling a second current electrode of the third pull-down transistor to ground.

18. A dual port static random access memory cell, comprising:
a first active region having a first size and shape;
a first pass transistor having a first current electrode and second current electrode in the first active region;
a first pull-down transistor having a first current electrode and a second current electrode in the first active region, wherein the first current electrode of the first pull-down transistor is in common with the second current electrode of the first pass transistor;
a second pass transistor having a first current electrode and second current electrode in the first active region;
a second pull-down transistor having a first current electrode and a second current electrode in the first active region, wherein the first current electrode of the second pull-down transistor is in common with the second current electrode of the second pass transistor and the second current electrode of the second pull-down transistor is in common with the second current electrode of the first pull-down transistor;
a second active region having the first size and shape;
a third pass transistor having a first current electrode and second current electrode in the second active region;
a third pull-down transistor having a first current electrode and a second current electrode in the second active region, wherein the first current electrode of the third pull-down transistor is in common with the second current electrode of the third pass transistor;
a fourth pass transistor having a first current electrode and second current electrode in the second active region;
a fourth pull-down transistor having a first current electrode and a second current electrode in the second active region, wherein the first current electrode of the fourth pull-down transistor is in common with the second current electrode of the fourth pass transistor and the second current electrode of the fourth pull-down transistor is in common with the second current electrode of the third pull-down transistor; and
a first pull-up transistor and a second pull-up transistor located between the first active region and the second active region.

19. The dual port static random access memory cell of claim 18, wherein:
the first current electrode of the first pull-down transistor is coupled to the first current electrode of the third pull-down transistor through a first metal layer having a second shape and size;
the first current electrode of the second pull-down transistor is coupled to the first current electrode of the fourth pull-down transistor through a second metal layer having the second shape and size;
the second current electrodes of the first, second, third, and fourth pull-down transistors are coupled to a ground terminal;
a first continuous conductive layer having a third size and shape is used as a gate for the first pull-down transistor and a gate for the third pull-down transistor;
a second continuous conductive layer having the third size and shape is used as a gate for the second pull-down transistor and a gate for the fourth pull-down transistor;
the first current electrode of the first pass transistor is coupled to a first bit line;
the first current electrode of the second pass transistor is coupled to a bit line complementary to the first bit line;
the first current electrode of the third pass transistor is coupled to a second bit line; and
the first current electrode of the fourth pass transistor is coupled to a bit line complementary to the second bit line.

* * * * *